United States Patent
Carlson

(10) Patent No.: US 10,557,203 B2
(45) Date of Patent: Feb. 11, 2020

(54) TEMPERATURE CONTROL SYSTEM AND PROCESS FOR GASEOUS PRECURSOR DELIVERY

(71) Applicant: Applied Materials, Inc., Santa Clara, CA (US)

(72) Inventor: David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/835,615

(22) Filed: Dec. 8, 2017

(65) Prior Publication Data

US 2018/0163307 A1 Jun. 14, 2018

Related U.S. Application Data

(60) Provisional application No. 62/433,052, filed on Dec. 12, 2016.

(51) Int. Cl.
| | |
|---|---|
| C23C 16/455 | (2006.01) |
| C23C 16/448 | (2006.01) |
| F25B 21/02 | (2006.01) |
| C23C 16/52 | (2006.01) |
| H01L 21/02 | (2006.01) |

(52) U.S. Cl.
CPC .......... *C23C 16/52* (2013.01); *C23C 16/4481* (2013.01); *C23C 16/4482* (2013.01); *C23C 16/45544* (2013.01); *F25B 21/02* (2013.01); *C23C 16/45561* (2013.01); *H01L 21/02271* (2013.01)

(58) Field of Classification Search
None
See application file for complete search history.

(56) References Cited

U.S. PATENT DOCUMENTS

| | | | |
|---|---|---|---|
| 4,612,772 A * | 9/1986 | Jones ................... | C23C 16/4482 62/3.3 |
| 5,078,922 A * | 1/1992 | Collins ................ | B01F 3/022 261/124 |
| 8,313,804 B2 | 11/2012 | Carlson et al. | |

(Continued)

FOREIGN PATENT DOCUMENTS

WO      2004007793 A2      1/2004

OTHER PUBLICATIONS

International Search Report and Written Opinion dated Mar. 26, 2018 for International Application No. PCT/US2017/065342.

*Primary Examiner* — Binu Thomas
(74) *Attorney, Agent, or Firm* — Patterson + Sheridan LLP

(57) ABSTRACT

Systems, methods and an apparatus used for delivery of chemical precursors, and more particularly to an ampoule for containing chemical precursors are provided. In one implementation, an apparatus for generating a chemical precursor used in a vapor deposition processing system is provided. The apparatus comprises a canister comprising a sidewall, a top, and a bottom surface encompassing an interior volume therein, an adhesion layer disposed over an outside surface of the sidewall and bottom surface, a thermally conductive coating disposed over the adhesion layer, an insulator layer disposed over the thermally conductive coating, wherein the thermally conductive coating over the bottom surface remains exposed and an inlet port and an outlet port in fluid communication with the interior volume.

19 Claims, 5 Drawing Sheets

(56) References Cited

U.S. PATENT DOCUMENTS

| | | |
|---|---|---|
| 8,951,478 B2 | 2/2015 | Chu et al. |
| 9,032,990 B2 | 5/2015 | Josephson et al. |
| 9,347,696 B2 | 5/2016 | Carlson et al. |
| 2005/0000428 A1* | 1/2005 | Shero .................. C23C 16/4402 118/715 |
| 2008/0149031 A1* | 6/2008 | Chu .................... C23C 16/4481 118/726 |
| 2009/0163732 A1 | 6/2009 | Stafford et al. |
| 2010/0116208 A1 | 5/2010 | Sangam |
| 2010/0136772 A1 | 6/2010 | Oosterlaken |
| 2013/0105483 A1 | 5/2013 | Carlson et al. |
| 2013/0269613 A1 | 10/2013 | Sanchez et al. |
| 2013/0319013 A1* | 12/2013 | Carlson ............... C23C 16/4482 62/3.2 |
| 2014/0302687 A1* | 10/2014 | Ashihara ............. C23C 16/4485 438/780 |
| 2015/0299858 A1 | 10/2015 | Yudovsky et al. |
| 2016/0333477 A1 | 11/2016 | Nehlsen et al. |

* cited by examiner

TEMPERATURE CONTROL SYSTEM AND PROCESS FOR GASEOUS PRECURSOR DELIVERY

CROSS-REFERENCE TO RELATED APPLICATIONS

This application claims benefit of U.S. Provisional Patent Application Ser. No. 62/433,052, filed Dec. 12, 2016, which is incorporated herein by reference in their entirety.

BACKGROUND

Field

Implementations described herein generally relate to systems, methods and an apparatus used for delivery of chemical precursors, and more particularly to ampoules for containing chemical precursors.

Description of the Related Art

Many semiconductor-processing techniques use precursors or reactants, which have been stored and/or shipped in ampoules. These precursors or reactants are typically supplied as solids or liquids. Since many deposition processes, or etch processes, and the like, are gas phase interactions with a substrate surface, it is necessary to evaporate or sublimate the precursors or reactants.

For example, a typical solid precursor is sublimated using a carrier or purge gas. The carrier gas is passed into an ampoule containing the solid precursor. The solid precursor sublimates and passes, with the carrier gas, into a processing chamber. Once the level of precursor in the ampoule has decreased below a certain level, the ampoule is replaced to provide a fresh supply of precursor. Ampoule changes in a clean room environment can have significant negative impacts. In some instances where the ampoule contains hazardous materials, the clean room is evacuated prior to changing out the ampoule. This contributes to both system downtime, which increases cost of ownership, and presents safety issues. Some precursor supply systems use liquid refill methods, but these liquid refill methods cannot be used for solids. In addition, significant damage has occurred in facilities due to malfunctioning of these liquid refill systems. Further, conventional methods and precursor delivery systems have need of significant space and support equipment.

Therefore, there is a need in the art for systems, apparatus and methods for maintaining the supply of chemical precursors to a chemical delivery system.

SUMMARY

Implementations described herein generally relate to systems, methods and an apparatus used for delivery of chemical precursors, and more particularly to an ampoule for containing chemical precursors. Implementations described herein generally relate to systems, methods and an apparatus used for delivery of chemical precursors, and more particularly to an ampoule for continuous delivery of chemical precursors. In one implementation, an apparatus for generating a chemical precursor is provided. The apparatus comprises a canister. The canister comprises a sidewall, a top surface, and a bottom surface encompassing an interior volume therein. The apparatus further comprises a thermally conductive coating disposed over an outside surface of the sidewall and bottom surface of the canister. The apparatus further comprises an insulator layer disposed over the thermally conductive coating, wherein the thermally conductive coating over the bottom surface remains exposed. The apparatus has an inlet port and an outlet port in fluid communication with the interior volume.

In another implementation, a temperature control system is provided. The temperature control system comprises a housing defining an internal volume. A first temperature control module is positioned in the internal volume of the housing. The first temperature control module comprises a first heat-exchanging module including one or more temperature control channels and a first ampoule assembly positioned on the first heat-exchanging module. The first ampoule assembly comprises a canister comprising a sidewall, a top surface, and a bottom surface encompassing an interior volume therein. The first ampoule assembly further comprises a thermally conductive coating disposed over an outside surface of the sidewall and the bottom surface of the canister. The first ampoule assembly further comprises an insulator layer disposed over the thermally conductive coating, wherein the thermally conductive coating over the bottom surface remains exposed. The ampoule assembly has an inlet port and an outlet port in fluid communication with the interior volume.

In another implementation, a system is provided. The system comprises a process chamber and an ampoule assembly fluidly coupled with the process chamber. The ampoule assembly comprises a canister comprising a sidewall, a top surface, and a bottom surface encompassing an interior volume therein. The ampoule assembly further comprises a thermally conductive coating disposed over an outside surface of the sidewall and bottom surface of the canister. The ampoule assembly further comprises an insulator layer disposed over the thermally conductive coating, wherein the thermally conductive coating over the bottom surface remains exposed. The ampoule assembly has an inlet port and an outlet port in fluid communication with the interior volume.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
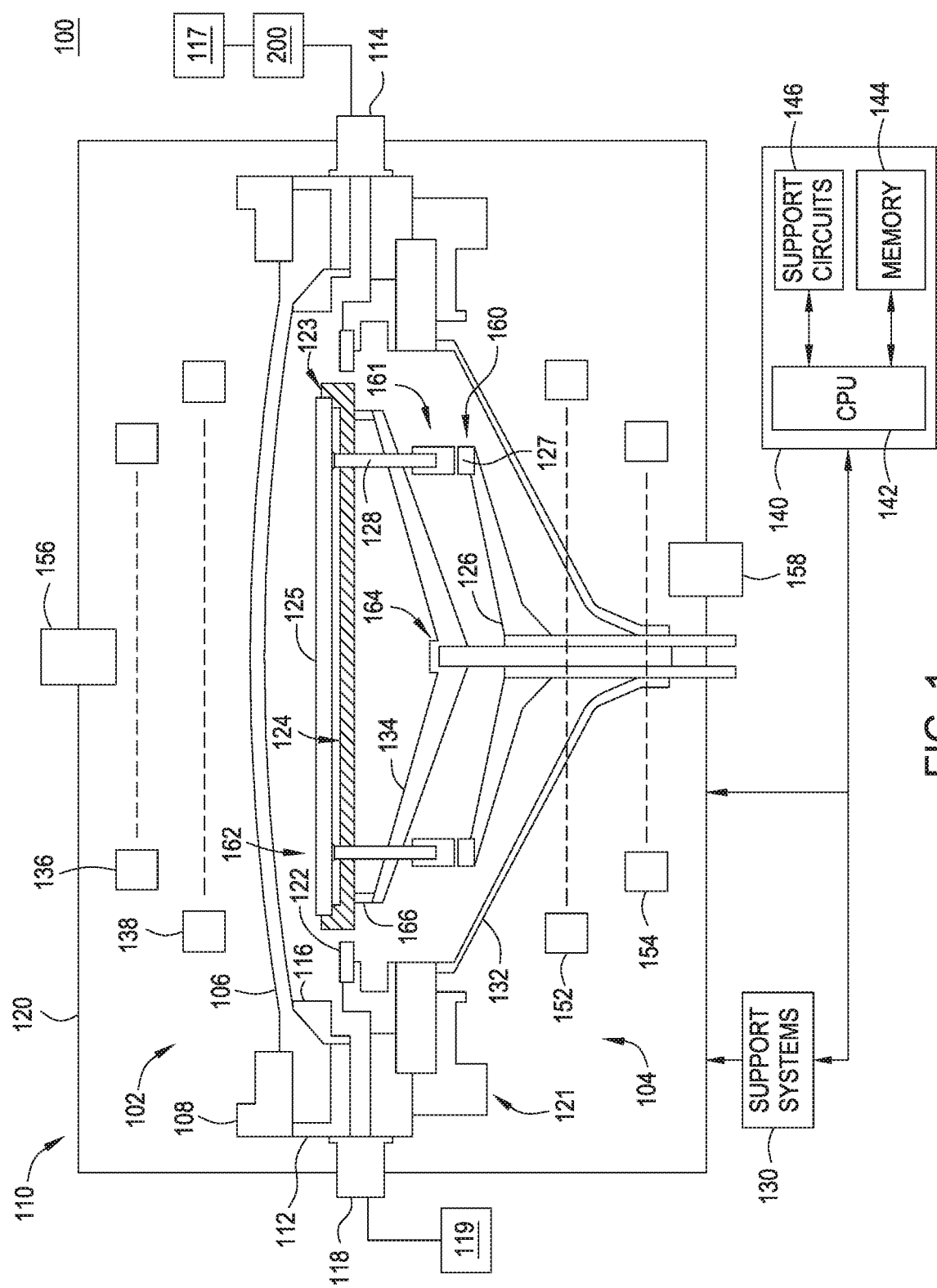
FIG. 1 is a schematic of a process chamber suitable for use with an ampoule assembly in accordance with one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes systems, methods and an apparatus used for delivery of chemical precursors. Certain details are set forth in the following description and in FIGS. 1-4 to provide a thorough understanding of various implementations of the disclosure. Other details describing well-known structures and systems often associated with ampoules and chemical delivery systems are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

While the particular apparatus in which the implementations described herein can be practiced is not limited, it is particularly beneficial to practice the implementations in processing systems such as the RADIANCE® RTP system, RADIANCEPLUS™ RTP system, VULCAN™ RTP system; in deposition systems such as the RP EPI system; on platforms such as the CENTURA® platform, ENDURA® platform, and the VANTAGE® platform all available from Applied Materials, Inc., Santa Clara, Calif. Additionally, processing systems and deposition systems available from other manufacturers may also benefit from implementations described herein. The processing chamber depicted in FIG. 1 is illustrative only and the present inventive methods and apparatus may be used to advantage in other processing chambers as well, including those configured for processes other than epitaxial deposition processes.

Methods and apparatus for generating and delivering process gases for processing substrates are provided herein. In some implementations, the inventive apparatus may advantageously provide source materials (e.g., solid-state precursors) to perform deposition processes while reducing or eliminating exposure of the operator to the toxic materials, thus increasing the safety and efficiency of the process. Implementations of the inventive apparatus may further advantageously provide an automatic feed of the source materials, thus reducing system downtime by providing the solid-state precursor in substantially constant amounts and by reducing exposure of the solid-state precursor to contaminants, thus maintaining a high purity of the solid-state precursor. Although not limiting in scope, the apparatus may be particularly advantageous in applications such as epitaxial deposition of Group III-V semiconductor materials and Group IV semiconductor materials, for example, arsenic (As) containing materials.

FIG. 1 depicts a schematic side view of a process chamber 100 suitable for use with an ampoule assembly for sublimating solid-state precursors in accordance with one or more implementations of the present disclosure. In some implementations, the process chamber 100 may be a commercially available process chamber, such as the RP EPI system, available from Applied Materials, Inc. of Santa Clara, Calif., or any suitable semiconductor process chamber adapted for performing deposition processes that has been modified for use with the precursor delivery apparatus as described herein. Other process chambers may also be used, however.

The process chamber 100 may generally comprise a chamber body 110, support systems 130, and a controller 140. An ampoule assembly 200 for sublimating solid-state precursors is coupled with the process chamber 100 via, for example, a process gas intake port, or inlet 114. The ampoule assembly 200 may generally be utilized to sublimate any compatible type of solid-state precursor needed for a specific application, for example, such as the exemplary solid-state precursors described below.

The chamber body 110 generally includes an upper portion 102, a lower portion 104, and an enclosure 120. A vacuum system 123 may be coupled to the chamber body 110 to facilitate maintaining a specific pressure within the chamber body 110. In some implementations, the vacuum system 123 may comprise a throttle valve (not shown) and vacuum pump 119 which are used to exhaust the chamber body 110. In some implementations, the pressure inside the chamber body 110 may be regulated by adjusting the throttle valve and/or vacuum pump 119. The upper portion 102 is disposed on the lower portion 104 and includes a lid 106, a clamp ring 108, a liner 116, a baseplate 112, one or more upper heating lamps 136 and one or more lower heating lamps 152, and an upper pyrometer 156. In some implementations, the lid 106 has a dome-like form factor, however, lids having other form factors (e.g., flat or reverse curve lids) are also contemplated. The lower portion 104 is coupled to the process gas intake port or inlet 114 and an exhaust port 118 and comprises a baseplate assembly 121, a lower dome 132, a substrate support 124, a pre-heat ring 122, a substrate lift assembly 160, a substrate support assembly 164, one or more upper heating lamps 138 and one or more lower heating lamps 154, and a lower pyrometer 158. Although the term "ring" is used to describe certain components of the process chamber 100, such as the pre-heat ring 122, it is contemplated that the shape of these components need not be circular and may include any shape, including but not limited to, rectangles, polygons, ovals, and the like.

During processing, a substrate 125 is disposed on the substrate support 124. The lamps 136, 138, 152, and 154 are sources of infrared (IR) radiation (e.g., heat) and, in operation, generate a pre-determined temperature distribution across the substrate 125. The lid 106, the clamp ring 108, and the lower dome 132 are formed from quartz; however, other IR-transparent and process compatible materials may also be used to form these components.

The substrate support assembly 164 generally includes a support bracket 134 having a plurality of support pins 166 coupled to the substrate support 124. The substrate lift assembly 160 comprises a substrate lift shaft 126 and a plurality of lift pin module(s) 161 selectively resting on respective pads 127 of the substrate lift shaft 126. In one implementation, a lift pin module 161 comprises an optional upper portion of the lift pin(s) 128 is movably disposed through a first opening 162 in the substrate support 124. In operation, the substrate lift shaft 126 is moved to engage the lift pin(s) 128. When engaged, the lift pin(s) 128 may raise the substrate 125 above the substrate support 124 or lower the substrate 125 onto the substrate support 124.

The support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a Central Processing Unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

The CPU 142 may be any form of a general-purpose computer processor that can be used in an industrial setting. The support circuits 146 are coupled to the CPU 142 and may comprise cache, clock circuits, input/output subsystems, power supplies, and the like. Software routines, such as the methods for processing substrates disclosed herein, may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively or in combination, in some implementations, for example where the process chamber 100 is part of a multi-chamber processing system, each process chamber of the multi-chamber processing system may have its own controller for controlling portions of the inventive methods disclosed herein that may be performed in that particular process chamber. In such implementations, the individual controllers may be configured similar to the controller 140 and may be coupled to the controller 140 to synchronize operation of the process chamber 100.

A gas source 117 may be coupled to the ampoule assembly 200 for sublimating solid-state precursors to provide one or more gases to facilitate sublimation of the solid-state precursor and/or delivery of the sublimated precursor (e.g., as described below). For example, in some implementations, the gas source 117 may provide a reactive gas, such as hydrogen ($H_2$), hydrogen chloride (HCl), chorine ($Cl_2$), bromine (Br), oxygen ($O_2$), methane ($CH_4$), or the like. Alternatively, or in combination, in some implementations the gas source may provide an inert gas or a carrier gas, for example such as helium (He), argon (Ar), xenon (Xe), or the like.

Figure 2:
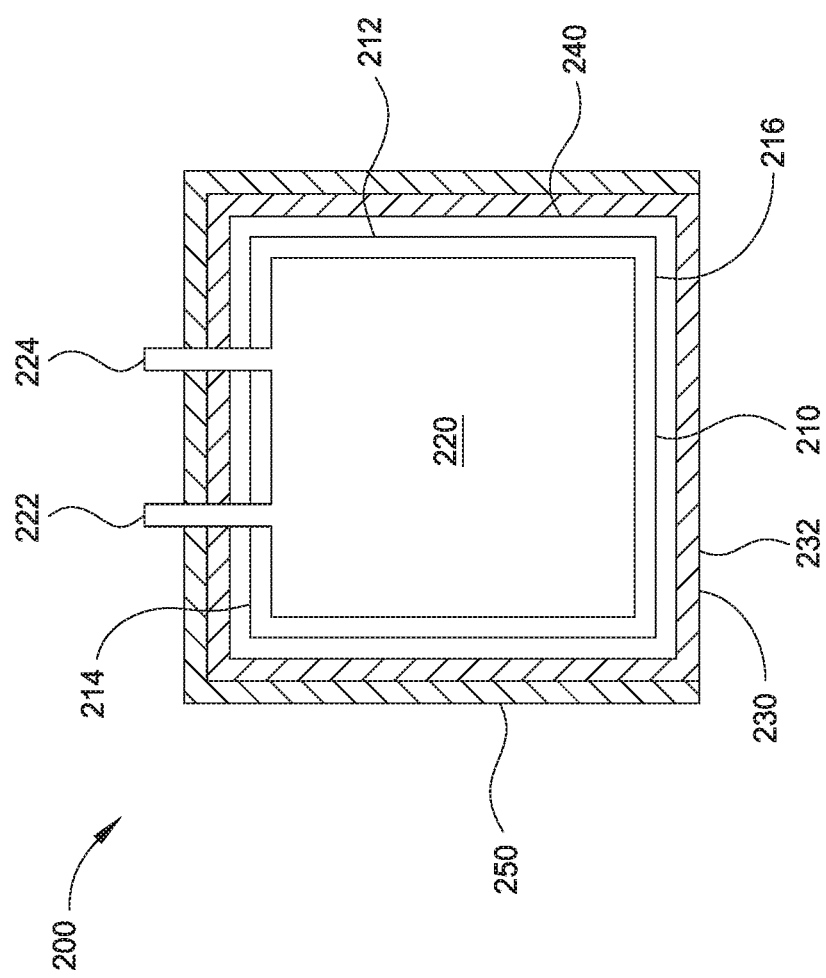
FIG. 2 is a schematic of an ampoule assembly in accordance with one or more implementations of the present disclosure.

FIG. 2 is a schematic of the ampoule assembly 200 in accordance with one or more implementations of the present disclosure. The ampoule assembly 200 includes a canister (e.g., ampoule or vessel) 210 having a sidewall 212, a top surface 214 and a bottom surface 216 encompassing an interior volume 220 therein. The ampoule assembly 200 further includes an inlet port 222 and an outlet port 224 in fluid communication with the interior volume 220. The inlet port 222 is disposed through the lid or the top surface 214 of the canister 210 and is configured to provide a gas to the interior volume 220 of the canister 210. The outlet port 224 is disposed through the lid or the top surface 214 of the canister 210 and is configured to allow a gaseous form of the solid-state precursor to flow out of the canister 210.

In some implementations, the canister 210 is certified by the Department of Transportation (DOT). For reasons of chemical compatibility and mechanical strength, the canister 210 is typically made of a stainless steel, such as 316 stainless steel (316 SST). The material of the canister 210 should be fairly chemically inert since different types of chemical precursors, such as highly reactive materials may be stored within the canister 210. In some implementations, the canister 210 may contain a plurality of baffles or solid heat-transfer particles to help evenly heat a solid precursor therein. In some implementations, the sidewall 212, the top surface 214 and the bottom surface 216 of the canister 210 each have a thickness from between about 2 millimeters to about 10 millimeters (e.g., from between about 2 millimeters to about 6 millimeters; or from between about 5 millimeters to about 6 millimeters).

A thermally conductive coating 230 is disposed over the outside surface of the canister 210. The thermally conductive coating 230 is disposed over the sidewall 212, the bottom surface 216 and optionally the top surface 214 of the canister 210. The thermally conductive coating 230 is more thermally conductive than the outside surface of the canister 210, which may be steel or stainless steel. The thermally conductive coating 230 may contain aluminum, aluminum nitride, copper, brass, silver, titanium, silicon nitride, or alloys thereof. In some implementations, the thermally conductive coating 230 contains aluminum.

The thermally conductive coating 230 may be bonded to the outside surface of the canister 210 by an optional bonding layer 240. In some implementations, the optional bonding layer 240 is disposed between the outside surface of the canister 210 and the thermally conductive coating 230. In some implementations, the optional bonding layer 240 permanently bonds the thermally conductive coating 230 with the canister 210. In some implementations where the thermally conductive coating 230 is permanently bonded with the canister 210 via bonding layer 240, the optional bonding layer 240 is a thermal epoxy layer. In some implementations, the optional bonding layer 240 thermally bonds the thermally conductive coating 230 with the canister 210 but does not permanently bond the thermally conductive coating 230 with the canister 210. In some implementations where the canister 210 is thermally bonded with the thermally conductive coating 230, the optional bonding layer 240 is a thermal grease. In some implementations, the thermally conductive coating 230 has a thickness from between about 2 millimeters to about 10 millimeters (e.g., from between about 2 millimeters to about 6 millimeters; or from between about 5 millimeters to about 6 millimeters).

In some implementations, the thermally conductive coating 230 has a uniform or substantially uniform thickness on the sidewall 212, the top surface 214, and the bottom surface 216 of the canister 210. Not to be bound by theory, but it is believed that uniform or substantially uniform thickness of the thermally conductive coating 230 minimizes thermal mass and improves the response time for heating and cooling materials within the canister 210.

An insulator layer 250 is disposed over the thermally conductive coating 230, wherein the thermally conductive coating 230 over the bottom surface remains exposed. The insulator layer 250 is typically disposed over the sidewall and optionally the top surface of the thermally conductive coating 230 while leaving the bottom surface of the thermally conductive coating 230 exposed. The insulator layer 250 functions as a hydrophobic barrier that either prevents or reduces condensation, which may form on the canister 210 and/or thermally conductive coating 230. This condensation may adversely affect the thermal conductivity of the canister and/or thermally conductive coating. It has been found by the inventors that exposing at least a portion of the thermally conductive coating 230 over the bottom surface 216 allows for better temperature control over the materials in the interior volume 220 of the canister 210. The insulator layer 250 may contain an insulating polymer. The insulator layer 250 may contain polytetrafluoroethylene (PTFE or Teflon), perfluoroalkoxy alkane (PFA), fluorinated ethylene propylene (FEP), and combinations thereof. In some implementations, the insulator layer 250 has a thickness from between about 2 millimeters to about 10 millimeters (e.g., from between about 2 millimeters to about 6 millimeters; or from between about 5 millimeters to about 6 millimeters).

In some implementations, the ampoule assembly 200 is formed by press fitting an aluminum ring around the canister 210 and bonding aluminum plates on the top surface 214 and the bottom surface 216 of the canister 210 to form the thermally conductive coating 230.

Ampoule assembly 200 may have a variety of sizes and geometries. Ampoule assembly 200 may have a volume capacitance of a chemical precursor within a range from about 0.5 L to about 10 L and more typically from about 1.2 L to about 4 L. In one example, ampoule assembly 200 has a volume capacitance of a chemical precursor of about 2.5 L. Chemical precursors that may be within ampoule assembly 200 include liquid, solid and gaseous precursors, preferably in gaseous states at predetermined temperatures and/or pressures. For example, the majority of a chemical precursor may remain in the solid-state in the ampoule assembly 200, but is heated to an elevated temperature during processing such that a small amount of the solid precursor sublimates directly into vapor. In another example, a chemical precursor may exist in the gaseous state at ambient pressure, but condenses to the liquid state upon being pressurized to a predetermined pressure within the ampoule.

FIG. 3 is a schematic of a temperature control system 300 for thermal management of substrate precursors in accordance with one or more implementations of the present disclosure. The temperature control system 300 includes two temperature control modules 310a, 310b (collectively 310) positioned in a housing 320 or secondary containment unit. The housing 320 includes a lid 322, a bottom wall 324 opposing the lid 322, and sidewalls 326a-d, which define an internal volume 328. In one implementation, the housing 320 is steel or stainless steel. In one implementation, the internal volume 328 is filled with a bulk insulating material (not shown). In one implementation, the housing 320 contains a leak detector 330 for detecting gases leaking from the ampoule assemblies 200a, 200b (collectively 200). The leak detector 330 may be positioned in a lower portion of the housing 320. The housing 320 further comprises an interconnect panel 340. In some implementations, the housing 320 includes one or more taper joints to improve contact with sidewalls of the housing 320. The interconnect panel 340 may be used to control the flow of gases and liquids into the housing 320.

The temperature control modules 310 includes a heat-exchanging module 350a, 350b (collectively 350) for controlling the temperature of each ampoule assembly 200a, 200b (collectively 200). Each ampoule assembly 200 includes a canister (e.g., ampoule or vessel) 210a, 210b having a sidewall 212a, 212b, a top surface 214a, 214b, and a bottom surface 216a, 216b encompassing an interior volume 220a, 220b therein. Each ampoule assembly 200a, 200b further includes an inlet port 222a, 222b and an outlet port 224a, 224b in fluid communication with the interior volume 220a, 220b. Each ampoule assembly 200a, 200b further includes a thermally conductive coating 230a, 230b. Each thermally conductive coating 230a, 230b may optionally be bonded to the outside surface of the canister 210a, 210b by an optional bonding layer 240a, 240b. An insulator layer 250a, 250b is disposed over each thermally conductive coating 230a, 230b, wherein the thermally conductive coating 230a, 230b over each bottom surface 216a, 216b remains exposed.

Each heat-exchanging module 350a, 350b includes a fluid delivery module 352a, 352b (collectively 352), a heat spreader plate 356a, 356b (collectively 356) and a thermoelectric module 354a, 354b (collectively 354) positioned in between the fluid delivery module 352 and the heat spreader plate 356.

The fluid delivery module 352 includes one or more temperature control channels 358a, 358b (collectively 358) coupled with a heat-exchanging system 360 for flowing a heat-exchanging fluid to the heat-exchanging module 350 to help regulate the temperature of each ampoule assembly 200a, 200b. In one implementation, the fluid delivery module 352 may be an aluminum, steel, or stainless steel plate having temperature control channels 358 formed therein. The fluid delivery module 352a includes a fluid inlet 362a and a fluid outlet 362b (See FIG. 3B). The fluid inlet 362a is fluidly coupled with the heat-exchanging system 360 for supplying suitable heat-exchanging fluids. In one implementation, the fluid delivery module 352a is fluidly coupled with the fluid delivery module 352b via fluid transfer pipes 364a, 364b. Suitable heat-exchanging fluids may include water, water-based ethylene glycol mixtures, a perfluoropolyether (e.g., Galden® fluid), oil-based thermal transfer fluids, or similar fluids.

The heat spreader plate 356 may be an aluminum, steel, or stainless steel plate. In some implementations, the heat spreader plate 356 contacts the exposed thermally conductive coating 232a, 232b (collectively 232) over the bottom surface 216a, 216b of each canister 210a, 210b. The heat spreader plate 356 is positioned on the thermoelectric module 354.

The thermoelectric module 354 is positioned on the fluid delivery module 352. In one implementation, a top surface of the thermoelectric module 354 contacts the heat spreader plate 356 and a bottom surface of the thermoelectric module 354 contacts the fluid delivery module 352. The thermoelectric module 354 uses the Peltier effect to create a heat flux between the heat spreader plate 356 and the fluid delivery module 352 to transfer heat from the heat spreader plate 356 to the fluid delivery module 352.

The temperature control system 300 further includes a controller 370. The controller 370 includes a central processing unit (CPU) 372, a memory 374, and a support circuit 376 utilized to control the process sequence and regulate gas flows. The CPU 372 may be of any form of a general-purpose computer processor that may be used in an industrial setting. The software routines can be stored in the memory 374, such as random access memory, read only memory, floppy, or hard disk drive, or other form of digital storage. The support circuit 376 is conventionally coupled to the CPU 372 and may include cache, clock circuits, input/output systems, power supplies, and the like. Bi-directional communications between the controller 370 and the various components of the temperature control system 300 are handled through numerous signal cables collectively referred to as signal buses 380a, 380b (collectively 380), some of which are illustrated in FIG. 3. Although the temperature control system 300 depicts two ampoule assemblies 200a, 200b, it should be understood that the temperature control system 300 may contain any number of ampoule assemblies 200a, 200b. For example, in one implementation, the temperature control system 300 includes a single ampoule assembly. It should also be understood that other ampoule assembly designs may benefit from the implementations of the present disclosure.

Figure 3A:
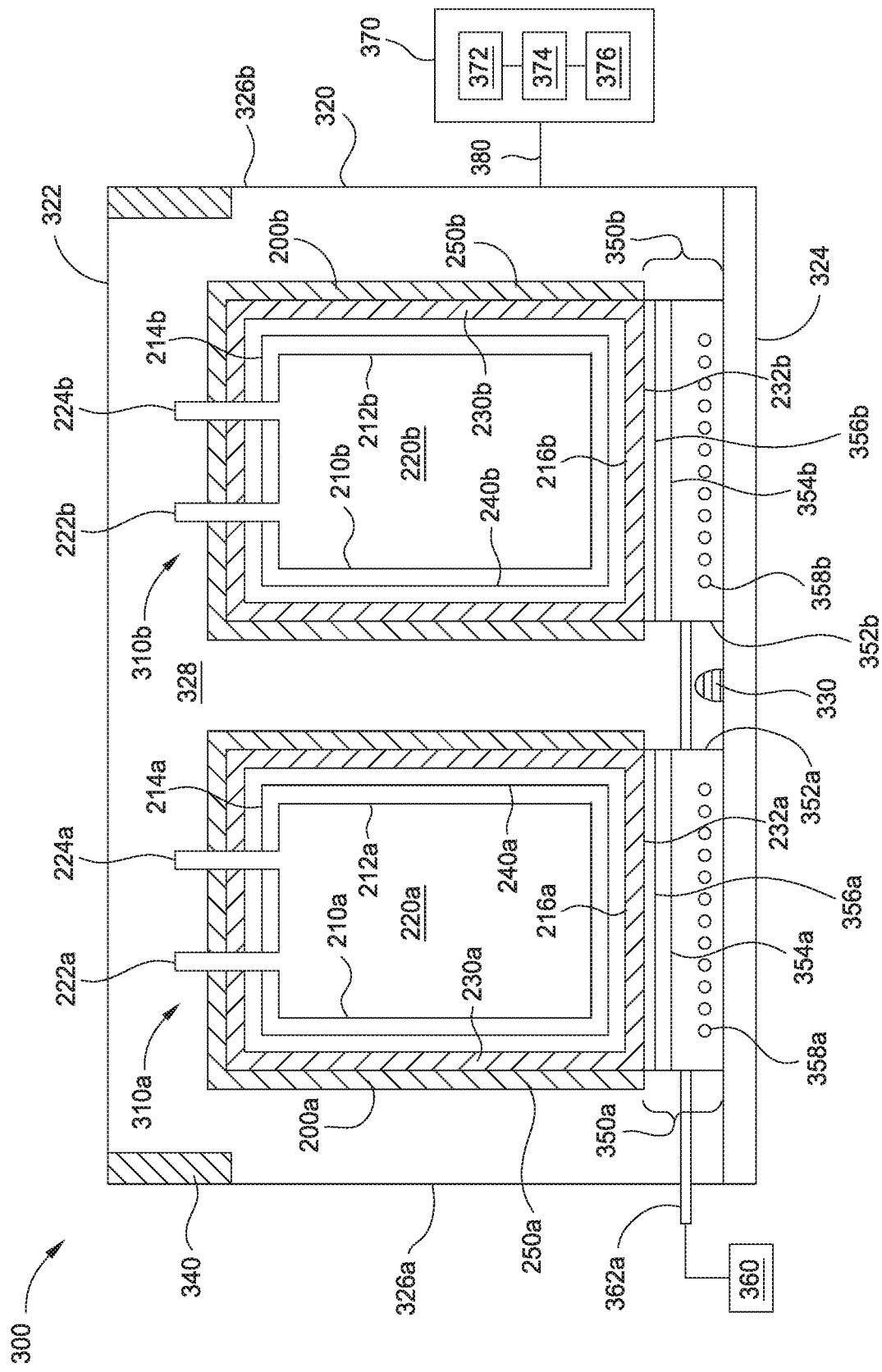
FIG. 3A is a schematic side view of an apparatus for thermal management of substrate precursors in accordance with one or more implementations of the present disclosure.
Figure 3B:
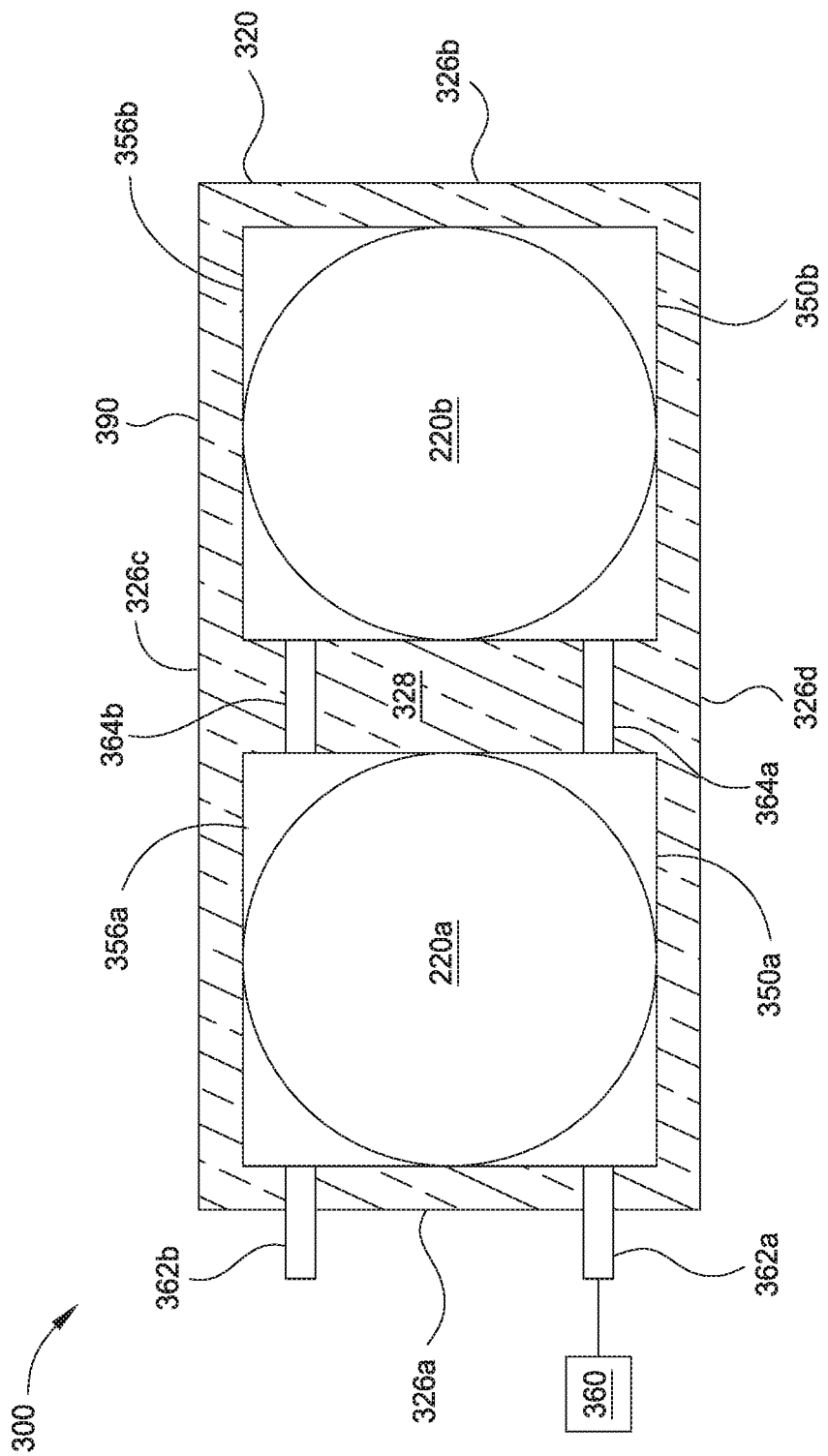
FIG. 3B is a schematic top view of the apparatus of FIG. 3A in accordance with one or more implementations of the present disclosure.

FIG. 3B is a schematic top view of the temperature control system 300 of FIG. 3A in accordance with one or more implementations of the present disclosure. FIG. 3B depicts that the internal volume 328 of the temperature control system 300 contains a bulk insulation 390. Any suitable insulation material that achieves the specified temperature control performance may be used. The bulk insulation material of the bulk insulation 390 may contain an insulating polymer. The bulk insulation material may contain polytetrafluoroethylene (PTFE or Teflon), perfluoroalkoxy alkane (PFA), fluorinated ethylene propylene (FEP), polyurethane, and combinations thereof. In one implementation, the bulk insulation 390 is molded foam insulation.

Figure 4:
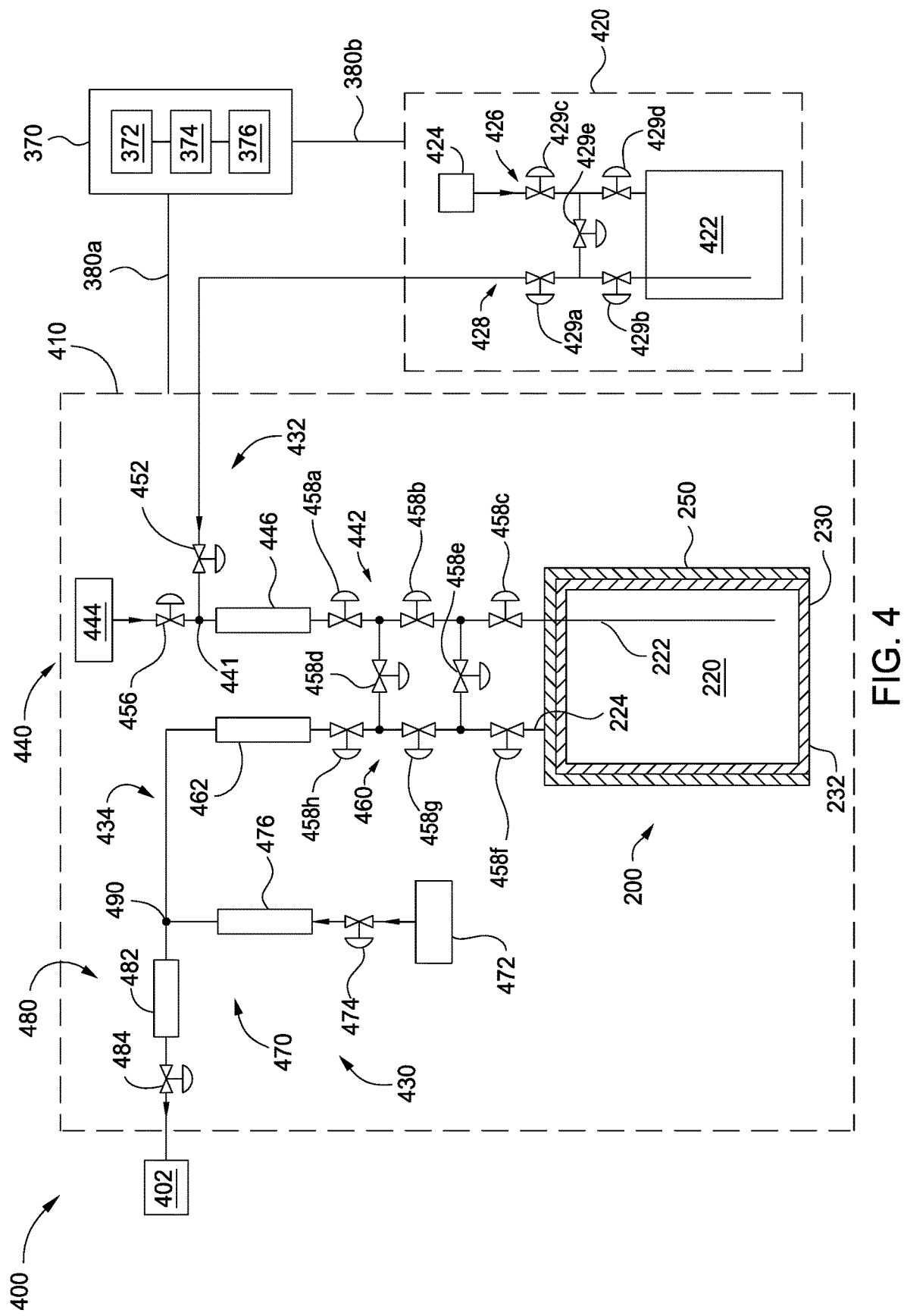
FIG. 4 is a schematic of a process gas delivery system that employs an ampoule in accordance with one or more implementations of the present disclosure.

FIG. 4 is a simplified schematic of a process gas delivery system 400, which is suitable for producing a process gas containing a chemical precursor and generally includes a process chamber 402 coupled to a gas panel 410 and a remote bulk precursor supply assembly 420 or "mother ampoule" for supplying a bulk liquid precursor. In one implementation, the process chamber 402 is the process chamber 100. The gas panel 410 and the remote bulk precursor supply assembly 420 may be controlled by the controller 370. Gas panel 410 generally controls the rate and pressure at which various process and carrier gases are delivered to the process chamber 402. Process chamber 402 may be a chamber to conduct vapor deposition process or thermal processes containing a vaporized chemical precursor in liquid, gaseous, or plasma state. In some implementations, process chamber 402 is generally a chemical vapor deposition (CVD) chamber, an epitaxial deposition chamber, or an atomic layer deposition (ALD) chamber.

A fluid delivery circuit 430 is generally intended to fluidly couple the remote bulk precursor supply assembly 420, which functions as a "mother" ampoule, to the ampoule assembly 200, which functions as a point of use ampoule, and process chamber 402 as necessary for operation of the process chamber 402. The fluid delivery circuit 430 is separated into a precursor replenishment line 432 and a precursor delivery line 434. The precursor replenishment line 432 delivers a gaseous precursor from the remote bulk precursor supply assembly 420 to the ampoule assembly 200 to replenish the amount of gaseous precursor in the ampoule assembly 200. The precursor delivery line 434 delivers the gaseous precursor from the ampoule assembly 200 to the process chamber 402.

The remote bulk precursor supply assembly 420 includes a bulk precursor storage tank 422 coupled with a push gas source or a first carrier gas source 424. The precursor replenishment line 432 includes a carrier gas inlet leg 426, a bulk precursor outlet leg 428, a first carrier gas delivery leg 440, and a bulk precursor inlet leg 442. The carrier gas inlet leg 426 couples the first carrier gas source 424 with the bulk precursor storage tank 422 via valves 429c-429d. The bulk precursor outlet leg 428 includes valves 429a, 429b, and 452. The first carrier gas delivery leg 440 couples a second carrier gas source 444 with the bulk precursor outlet leg 428 at junction 441 via valve 456.

Chemical precursors that may be within the bulk precursor storage tank 422 include liquid, solid and gaseous precursors, preferably in solid or fluid-like states at predetermined temperatures and/or pressures. For example, a chemical precursor may exist in the solid-state at room temperature, but melts to the liquid state upon being heated to a predetermined temperature within the bulk precursor storage tank 422. In another example, the majority of a chemical precursor may remain in the solid-state in the bulk precursor storage tank 422, but is heated to an elevated temperature during processing such that a small amount of the solid precursor sublimates directly into vapor. In another example, a chemical precursor may exist in the gaseous state at ambient pressure, but condenses to the liquid state upon being pressurized to a predetermined pressure within the bulk precursor storage tank 422.

The precursor replenishment line 432 includes the carrier gas inlet leg 426, the bulk precursor outlet leg 428, a bulk precursor inlet leg 442, a second carrier gas source 444 (e.g., hydrogen gas source), mass flow controller 446, valves 452, 456, 458a-c, which delivers the bulk precursor to the ampoule assembly 200 for replenishment. The precursor delivery line 434 includes the precursor supply outlet leg 460, a second carrier gas delivery leg 470, and a chamber inlet supply leg 480. The precursor supply outlet leg 460, the second carrier gas delivery leg 470, and the chamber inlet supply leg 480 meet at a junction 490.

The precursor supply outlet leg 460 includes valves 458f-458h and a mass flow meter 462. The second carrier gas delivery leg 470 couples a third carrier gas source 472 to the precursor supply outlet leg 460 and the chamber inlet supply leg 480 at junction 490 via valve 474 and a carrier gas mass flow controller 476. The chamber inlet supply leg 480 couples the process chamber 402 with the precursor supply outlet leg 460 and the second carrier gas delivery leg 470 at junction 490 via bypass controller 482 and valve 484.

The precursor delivery line 434 includes the precursor supply outlet leg 460, valves 458f-458h, and a mass flow meter 462 for monitoring the flow of precursor gas. The second carrier gas delivery leg 470 is fluidly coupled with the precursor delivery line 434 for delivering a carrier gas to the precursor delivery line 434 via junction 490. The second carrier gas delivery leg 470 includes the third carrier gas source 472 (e.g., hydrogen gas source) coupled with the carrier gas mass flow controller 476 via a valve 474.

The carrier gas sources 424, 444, and 472 typically each independently supply a carrier gas such as nitrogen, hydrogen, argon, helium, or combinations thereof. Additional carrier gas sources (not shown) may also be fluidly coupled to the fluid delivery circuit 430 when the use of specialized purge fluids, such as a purge liquid, is needed. Valves 429a-429e, 452, 456, 458a-458h, 474 and 484 are typically remotely controlled valves that serve to divert the flow of fluids within the fluid delivery circuit 430 and/or are used to selectively isolate the various components within the fluid delivery circuit 430 to facilitate removal, replacement and/or service of an isolated component, including the ampoule assembly 200. Valves 429a-429e, 452, 456, 458a-458h, 474 and 484 are generally pneumatically or electronically controlled and the internal wetted surfaces thereof are fabricated from materials compatible with the process and other fluids handled by the fluid delivery circuit 430. Typically, valves 429a-429e, 452, 456, 458a-458h, 474 and 484 are actuated in response to a signal from the controller 370 to coordinate the delivery of gases through the fluid delivery circuit 430. Sensors (not shown) may be incorporated into the system to detect the temperature of a process, carrier, and/or purge fluid flowing through the fluid delivery circuit 430, such as a thermocouple disposed against the precursor delivery line 434.

In operation, a push gas from the first carrier gas source 424 flows into the "mother ampoule" or bulk precursor storage tank 422, where a solid-state precursor is heated to a gaseous state to form a gaseous precursor. The push gas delivers the gaseous precursor via precursor replenishment line 432 into the point-of-use ampoule or the ampoule assembly 200 to resupply the ampoule assembly 200 with fresh precursor. Thus, the ampoule assembly 200 is maintained at a constant level, temperature and pressure and can be resupplied without removing the ampoule assembly 200 from the system.

In some implementations, the push gas goes to a remote "mother ampoule" to resupply a point-of-use ampoule with fresh saturated precursor. Thus, the point-of-use ampoule is maintained at a constant Level, temperature and pressure. In some implementations, a push MFC is the same but a concentration monitor is replaced with a Mass Flow Meter (MFM). For Liquid delivery, the MFC and MFM are matched by flowing the inert gas through a bypass. The "bypass" is then switched to point-of-use ampoule for saturated precursor delivery the MFC and MFM are matched by flowing the inert gas through the bypass. The Remote Source is then switched to the MFC and flows through the MFM. The "bypass" is then switched to Point-of-Use Ampoule Use the temperature, pressure, and delta flows to calculate concentration of the incoming precursor and the precursor to the chamber.

In some implementations, the temperature control system is water-cooled rather than air-cooled. In some implementations, a "taper joint" is used for improved contact to the sidewall. In some implementations, a "thermal sheet" or "thermal compound" is used for surface conduction. In some implementations, two temperature control modules 310a, 310b are installed in the housing 320 with mounting of the POC's. In some implementations, the insulation used in the housing minimizes impact to the tool uptime. In some implementations, the point of use ampoules should not need to be changed.

In summary, implementations of the present disclosure provide improved systems, methods and apparatus used for delivery of chemical precursors. In some implementations, the inventive apparatus may advantageously provide source materials (e.g., solid-state precursors) necessary to perform chosen deposition processes while reducing or eliminating exposure of the operator to the toxic materials, thus increasing the safety and efficiency of the process. Implementations of the inventive apparatus may further advantageously provide an automatic feed of the source materials, thus reducing system downtime by providing the solid-state precursor in substantially constant amounts and by reducing exposure of the solid-state precursor to contaminants, thus maintaining a high purity of the solid-state precursor. In addition, some implementations of the present disclosure provide improved temperature control by replacing traditional air-cooled systems with a water-cooled system.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A temperature control system, comprising:
a housing defining an internal volume; and
a first temperature control module positioned in the internal volume of the housing, comprising:
 a first heat-exchanging module, comprising:
  a fluid delivery module plate having one or more temperature control channels formed therein;
  a heat spreader plate; and
  a thermoelectric module positioned in between the fluid delivery module plate and the heat spreader plate and operable to create a heat flux between the heat spreader plate and the fluid delivery module plate; and
 a first ampoule assembly, comprising:
  a first canister comprising a sidewall, a top surface, and a bottom surface encompassing an interior volume therein;
  a thermally conductive coating disposed over an outside surface of the sidewall and the bottom surface of the first canister;
  an insulator layer disposed over the thermally conductive coating, wherein the thermally conductive coating over the bottom surface of the first canister remains exposed and contacts the heat spreader plate;
  a bonding layer disposed over the outside surface of the first canister in between the outside surface of the first canister and the thermally conductive coating; and
  an inlet port and an outlet port in fluid communication with the interior volume.

2. The temperature control system of claim 1, further comprising:
a second temperature control module positioned in the internal volume of the housing adjacent the first temperature control module, comprising:
 a second heat-exchanging module, comprising:
  a second fluid delivery module plate having one or more temperature control channels formed therein;
  a second heat spreader plate; and
  a second thermoelectric module positioned in between the second fluid delivery module plate and the second heat spreader plate and operable to create a heat flux between the second heat spreader plate and the second fluid delivery module plate; and
 a second ampoule assembly, comprising:
  a second canister comprising a sidewall, a top surface, and a bottom surface encompassing a second interior volume therein;
  a second thermally conductive coating disposed over the sidewall and the bottom surface of the second canister;
  a second insulator layer disposed over the second thermally conductive coating, wherein the second thermally conductive coating over the bottom surface of the second canister remains exposed; and
  a second inlet port and a second outlet port in fluid communication with the second interior volume of the second canister.

3. The temperature control system of claim 1, wherein the outside surface of the first canister comprises steel, stainless steel, nickel, chromium, or alloys thereof.

4. The temperature control system of claim 3, wherein the thermally conductive coating comprises a material selected from aluminum, aluminum nitride, copper, brass, silver, titanium, silicon nitride, alloys thereof, and combinations thereof.

5. The temperature control system of claim 3, wherein the thermally conductive coating comprises a material selected from aluminum, copper, and combinations thereof.

6. The temperature control system of claim 1, wherein the insulator layer comprises polytetrafluoroethylene.

7. The temperature control system of claim 1, wherein the housing contains a bulk insulation material.

8. The temperature control system of claim 7, wherein the bulk insulation material is molded foam insulation.

9. The temperature control system of claim 7, wherein the bulk insulation material is selected from polytetrafluoroethylene (PTFE or Teflon), perfluoroalkoxy alkane (PFA), fluorinated ethylene propylene (FEP), polyurethane, or a combination thereof.

10. The temperature control system of claim 1, wherein the interior volume is within a range from about 0.5 liters to about 10 liters.

11. The temperature control system of claim 1, wherein the bonding layer is a thermal epoxy layer or a thermal grease layer.

12. The temperature control system of claim 1, wherein the insulator layer is disposed over a top surface of the thermally conductive coating and a sidewall of the thermally conductive coating, wherein all of the thermally conductive coating over the bottom surface of the first canister remains exposed.

13. The temperature control system of claim 2, wherein the fluid delivery module plate further comprises a fluid inlet pipe fluidly coupled with the one or more temperature control channels of the of the fluid delivery module plate and a fluid outlet pipe fluidly coupled with the one or more temperature control channels of the fluid delivery module plate.

14. The temperature control system of claim 13, wherein the one or more temperature control channels of the fluid delivery module plate are fluidly coupled with the one or more temperature control channels of the second fluid delivery plate via fluid transfer pipes.

15. A temperature control system, comprising:
a housing comprising:
a lid;
a bottom wall opposing the lid; and
sidewalls, wherein the lid, bottom wall and sidewalls define an internal volume; and
a first temperature control module positioned in the internal volume of the housing, comprising:
a first heat-exchanging module, comprising:
a fluid delivery module plate having one or more temperature control channels formed therein;
a heat spreader plate; and
a thermoelectric module positioned in between the fluid delivery module plate and the heat spreader plate and operable to create a heat flux between the heat spreader plate and the fluid delivery module plate; and
a first ampoule assembly, comprising:
a first stainless steel canister comprising a sidewall, a top surface, and a bottom surface encompassing an interior volume therein, wherein the interior volume is within a range from about 0.5 liters to about 10 liters;
a thermally conductive coating disposed over an outside surface of the sidewall and the bottom surface of the first stainless steel canister, wherein the thermally conductive coating comprises aluminum;
an insulator layer comprising polytetrafluoroethylene disposed over a top surface and a sidewall of the thermally conductive coating, wherein the thermally conductive coating over the bottom surface of the first stainless steel canister remains exposed and contacts the heat spreader plate;
a bonding layer disposed over the outside surface of the first stainless steel canister in between the outside surface of the first stainless steel canister and the thermally conductive coating; and
an inlet port and an outlet port in fluid communication with the interior volume.

16. The temperature control system of claim 15, further comprising:
a second temperature control module positioned in the internal volume of the housing adjacent the first temperature control module, comprising:
a second heat-exchanging module, comprising:
a second fluid delivery module plate having one or more temperature control channels formed therein;
a second heat spreader plate; and
a second thermoelectric module positioned in between the second fluid delivery module plate and the second heat spreader plate and operable to create a heat flux between the second heat spreader plate and the second fluid delivery module plate; and
a second ampoule assembly, comprising:
a second stainless steel canister comprising a sidewall, a top surface, and a bottom surface encompassing a second interior volume therein;
a second thermally conductive coating disposed over the sidewall and the bottom surface of the second stainless steel canister, wherein the second thermally conductive coating comprises aluminum;
a second insulator layer comprising polytetrafluoroethylene disposed over the second thermally conductive coating, wherein the second thermally conductive coating over the bottom surface of the second stainless steel canister remains exposed; and
a second inlet port and a second outlet port in fluid communication with the interior volume of the second stainless steel canister.

17. The temperature control system of claim 16, wherein the fluid delivery module plate further comprises a fluid inlet pipe fluidly coupled with the one or more temperature control channels of the of the fluid delivery module plate and a fluid outlet pipe fluidly coupled with the one or more temperature control channels of the fluid delivery module plate.

18. The temperature control system of claim 17, wherein the one or more temperature control channels of the fluid delivery module plate are fluidly coupled with the one or more temperature control channels of the second fluid delivery plate via fluid transfer pipes.

19. The temperature control system of claim 17, wherein the fluid inlet pipe is fluidly coupled with a heat-exchanging system operable to deliver a heat-exchanging fluid to the fluid delivery module plate and the second fluid delivery module plate.

* * * * *